United States Patent [19]

Shifrin

[11] 4,021,675
[45] May 3, 1977

[54] SYSTEM FOR CONTROLLING ION IMPLANTATION DOSAGE IN ELECTRONIC MATERIALS

[75] Inventor: Gordon A. Shifrin, Malibu, Calif.

[73] Assignee: Hughes Aircraft Company, Culver City, Calif.

[22] Filed: Jan. 2, 1975

[21] Appl. No.: 538,287

Related U.S. Application Data

[63] Continuation-in-part of Ser. No. 333,913, Feb. 20, 1973, abandoned.

[52] U.S. Cl. .......................................... 250/492 A
[51] Int. Cl.² ...................................... G01N 23/00
[58] Field of Search ............ 250/492 R, 492 A, 396

[56] References Cited

UNITED STATES PATENTS

| | | | |
|---|---|---|---|
| 3,308,264 | 3/1967 | Ullery | 250/492 A |
| 3,330,696 | 7/1967 | Ullery et al. | 250/492 A |
| 3,388,009 | 7/1968 | King | 250/492 A |
| 3,651,303 | 3/1972 | Rehme | 250/492 A |
| 3,689,766 | 9/1972 | Freeman | 250/492 A |
| 3,778,626 | 12/1973 | Robertson | 250/492 A |

*Primary Examiner*—Alfred E. Smith
*Assistant Examiner*—Bruce C. Anderson
*Attorney, Agent, or Firm*—William J. Bethurum; W. H. MacAllister

[57] ABSTRACT

Disclosed is an ion implantation process control system wherein the ion dosage in semiconductor wafers is continuously controlled. This control is achieved by controllably and incrementally integrating the ion beam current to provide a control signal, and then utilizing this control signal to provide controlled relative movement between the ion beam and the surface area upon which it fails.

15 Claims, 3 Drawing Figures

SYSTEM FOR CONTROLLING ION IMPLANTATION DOSAGE IN ELECTRONIC MATERIALS

The invention herein described was made in the course of or under a Contract or Subcontract thereunder with the Department of the Air Force.

FIELD OF THE INVENTION

This is a continuation-in-part application of Ser. No. 333,913, filed Feb. 20, 1973 now abandoned. This invention relates generally to ion implantation in electronic materials and more particularly to the continuous incremental control of the ion implantation dosage in semi-conductors during a wafer processing operation.

BACKGROUND

As is well known, the electrical characteristics of a wide range of semiconductive devices may be fixed and controlled by controlling the ion implantation dosage of semiconductor wafers when these wafers are impurity doped in this manner during processing. The ion implantation dosage is usually measured in ions per square centimeter of the semiconductor surface area bombarded, and this parameter is directly related to, among other things, the electrical resistivity of the wafer for a given set of ion implantation conditions. This dosage also determines the maximum point of the Gaussian impurity profile within the wafer for a particular ion type and beam energy. The process of ion implantation has many advantages over the older diffusion processes, a significant one of which is the lower processing temperatures to which the wafers are subjected during an ion implantation operation and subsequent annealing processes.

PRIOR ART

Hitherto, a common practice known to me for controlling the ion implantation dosage in semiconductors involved the steps of: (a) exposing a plurality of wafers (usually only one) in a tray or the like to either a stationary ion beam or an ion beam scanned over a defined raster, (b) integrating the current density of the ion beam in order to determine when a desired ion dosage in the wafer is reached, and (c) removing the ion beam from the exposed wafers (or the wafers from the beam pattern) and then repeating the above procedure on another wafer or tray of wafers. With the exception of the scanning in the above process, there is no net relative motion between the beam raster and the wafers.

While the above process has been generally satisfactory for its intended purpose, it is somewhat inflexible in that this process is based upon attaining a desired ion implantation dosage in a given wafer or group of wafers before any control is exercised over the process, vis-a-vis the net movement of the ion beam or beam raster with respect to its target. Thus, the above-described prior art is discontinous or batch process in the sense that is based upon first providing one or more wafers within a given beam pattern or raster with a given ion dosage and then interrupting the doping process in order to remove all of the wafers from the ion beam pattern or raster before repeating this procedure. Furthermore, the above ion implanation technique cannot accomodate the continuous relative movement between the ion implantation beam and its implanted target area, a feature which would render this prior process more readily adaptable to high volume ion implantation dping. This added dimension of doping control is provided by the present inventive process and will be described in further detail hereinafter.

THE INVENTION

The general purpose of this invention is to provide a novel alternative approach to the above-described prior art process and one which possesses most, if not all, of the advantages of the above prior art process, while processing none of its significant disadvantages. To attain this purpose, I have provided a wafer process control system wherein semiconductor wafers are controllably exposed to a plane target area into which an impurity ion beam is continuously implanted. The system includes means for incrementally integrating the ion beam current a predetermined number of times and for generating a control signal in response thereto. This control signal is utilized to provide controlled relative movement between the ion beam and the actual surface area upon which the ion beam falls. In a preferred embodiment of the invention, this latter surface area is incrementally moving relative to the ion beam pattern or raster at a self-controlled rate. The target area may advantageously be an annular rotating surface used to carry a plurality of wafers through the fixed ion beam pattern or raster at a speed determined by an implanted dose which has been previously selected and programmed. In this embodiment, the target area is a pre-established geometry as will be describe. The above annular rotating surface can be continuously loaded and unloaded during the above ion implantation doping process to thereby provide a continuous high volume doping operation.

Accordingly, an object of the present invention is to provide a new and improved wafer process control system for the continuous control of ion implantation doping in semiconductors or other suitable electronic materials.

Another object is to provide an improved system of the type described in which continuous control of a prescribed ion dosage may be automatically exercised throughout the entire ion implantation process, and not just at fixed intervals therein.

A further object is to provide a new and improved high volume ion implantation process control system which can be used to continuously accommodate large numbers of wafers and which is especially well suited for the rapid loading and unloadng of these wafers onto a continuously moving support member, such as a straight or continuous annular conveyor belt.

A futher object is to provide a new and improved wafer process control system of the type described which may be economically constructed using individually known electronic components, includng low cost commercially available compact integrated circuits which render the system economical of construction and reliable and durable in operation.

A still further object is to provide a control system of the type described which is simple in mechanical and electrical construction and easy to operate.

DRAWINGS

Figure 1:
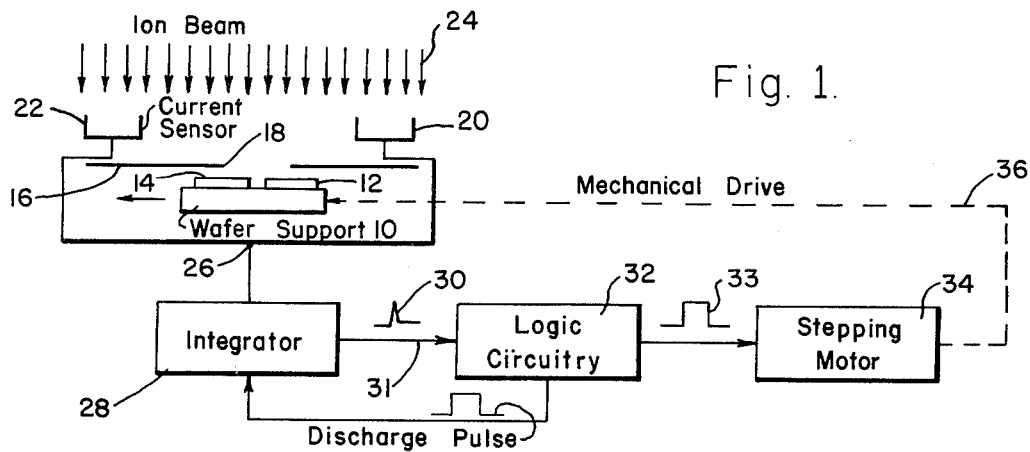
FIG. 1 is a functional block diagram of the wafer process control system according to the invention.

Referring now to FIG. 1, there is shown a motor driven wafer supporting member or tray 10 which carries a plurality of individual wafers, such as wafers 12 and 14, which have been previously loaded onto member 10 at desired locations by an operator. This support member 10 is operatively positoned to move beneath a mask 16 having an opening 18 therein of predetermined geometry as will be further described below. Both the mask 16 and a pair of current sensors 20 and 22 are exposed as shown to an impurity ion beam 24 of a predetermined pattern or raster such that, for a given beam current, the average number of ions over each portion of the raster per unit area per unit time is uniform. Only the ions passing through the mask opening 18 are implanted in the wafers on the tray 10.

The two current sensors 20 and 22 may advantageously be Faraday cups which have well-known current sensing characteristics and which collect sampled portions of the ion beam 24 currents. These currents are conducted through a common electrical circuit node 26 and into the input of an integrator 28. While the separate peripheral sensors 20 and 22 are preferred, the current collected by support member 10 could also be used to drive the integrator 28. The above construction which employs the separate sensors 20 and 22 removes the wafers from the electrical circuit of the integrator 28, permitting the member 10 to be grounded, and eliminating any effects of secondary electrons emanating from the wafers. Thus both mechanical and electrical simplicity are enhanced by the use of this preferred embodiment of the invention. The schematic details of this integrator are disclosed below with reference to FIG. 3.

The integrator 28 provides multiple successive integrations on the signal current received from the common input node 26 and generates a plurality of corresponding output pulses 30 on line 31 as shown. A pulse 30 is generated each time the voltage level at the input of the integrator 28 exceeds a predeterminde threshold level. The control pulses 30 are utilized to drive a conventional transistor logic circuit stage 32, which stage 32 may advantageously include a Schmitt trigger. The Schmitt trigger is a well-known circuit which switches from one to another of two discrete output voltage levels once its input switching threshold is exceeded. Simultaneously, the logic circuitry 32 provides a feedback discharge pulse via line 33 to the integrator 28 and there serves to bias appropriate semiconductior circuitry to conduction and discharge the integrating capacitors of stage 28. This action enables the integrator 28 to provided many successive integrations of the input signal current received from circuit node 26. In order to program a desired ion implanted dose, the exact value of dose represented by each of these integrations may be varied in accordance with the integrator calibration techniques described below with reference to FIG. 3.

After suitable amplification, the output pulses 33 of the digital logic circuitry 32 are coupled to the input drive terminal of a conventional stepping motor 34 which incrementally drives the movable wafer support member 10 by suitable mechanical means 36. This means may be a motor shaft (not shown) which is directly or indirectly coupled to the support member 10 to rotate slame at a prescribed rate in response to the mechanical output of the stepping motor 34. The closed loop control system of FIG. 1 is calibrated by a simple adjustment of the integrator 28, so that each integration represents a definite incremental ion dose delivered to the implanted target area through which the wafers pass. The length of time that wafers are exposed to the mask opening 18 for each incremental step is inversely proportional to the average current flowing from the input node 26 to the integrator 28. This current is in turn proportional to the ions per square centimeter beam dosage received by the Faraday cup current sensors 20 and 22, so that the ion beam exposure time for the semiconductor wafers 12 is incrementally controlled as a direct function of the ion beam dosage received by these wafers.

The support member 10 may, for example, be a straight continuous conveyor belt, in which case the mask opening 18 will be rectangular. In the alternative, the movable member 10 may be an annular belt or table which is rotatable about a central axis, and in the latter example, the opening 18 will have a pie-shaped geometry, such as that of the opening 18' in FIG. 2. The advantageous features of this annular construction are described below.

Figure 2:
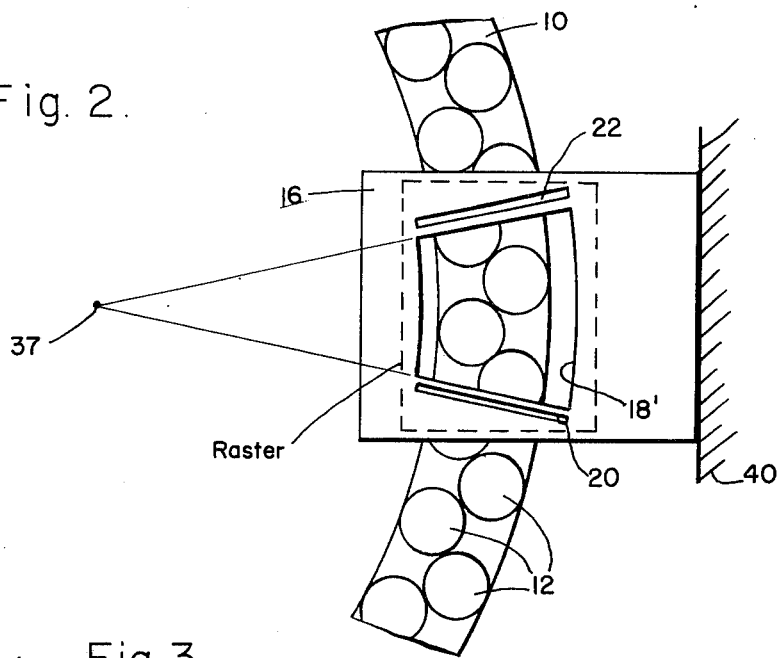
FIG. 2 is a fragmentary plan view of one geometry for the ion beam masking and the current sensor apparatus for the system in FIG. 1.

Referring now to FIG. 2, the annular support member or tray 10 rotates about a central axis 37, and the pie-shaped mask opening 18' accommodates the radial differences in linear speed of the wafers 12 on tray 10. The sides of the pie-shaped opening 18' should intersect at the rotational axis 37 as shown in FIG. 2. Thus, the wafers closer to the rotational axis 37 move slower through a given ion beam pattern and therefore need to be exposed to a smaller segment of a given pattern than do the more remote wafers. In this manner, all of the wafers 12 will receive the same total ion dosage while they pass beneath the mask opening 18'. The mask 16 may be secured to a stationary housing 40 by any suitable means. Wafers may be packed as densely as possible onto the exposed annular area of the tray 10. However, in order to have room to set up and start the ion implantation process, a pie-shaped area on the tray corresponding to the opening 18' must initially be left empty. Thereafter, no other spaces need be left empty as long as the ion implantation cntinues. In the case of a continuous straight conveyor belt, a corresponding rectangular space should be left empty initially.

The implanted area on the member 10 exposed at any instant in time by the mask opening 18' is limited in one dimension by the correspondng dimenson of the ion beam raster 24. This dimension is in a direction at right angles to the mechanical sweep of the moving support member 10. However, in the direction of the mechanical sweep, the implanted area is unlimited, which means that the entire annular surface region of the annular member 10 in FIG. 2 can, if desired, be implanted in one continuous operation. Furthermore, in a linear system using an endless conveyor belt, this dimension of implant exposure is equally unrestricted, and so far as I am aware, these implant area dimensional features of my invention as illustrated in FIG. 2 are totally nove.

Since the ion beam 24 defining the raster is swept in both the X and Y mutually perpendicular directions, then the uniformity of the ion implantation density and area distribution is enhanced, and this latter feature can be particularly advantageous in the fabrication of certain high grade ion implanted semiconducted devices. Additionally, the net relative motion between the raster and the moving tray 10 provides further enhancement of the doping uniformity. However, in instances where it is preferred not to employ the two-axis high voltage ion beam scanners required for the X–Y raster, one may choose to rely entirely on scanning the ion beam in only a single direction which is at right angles to the mechanical sweep of the moving support member 10.

Figure 3:
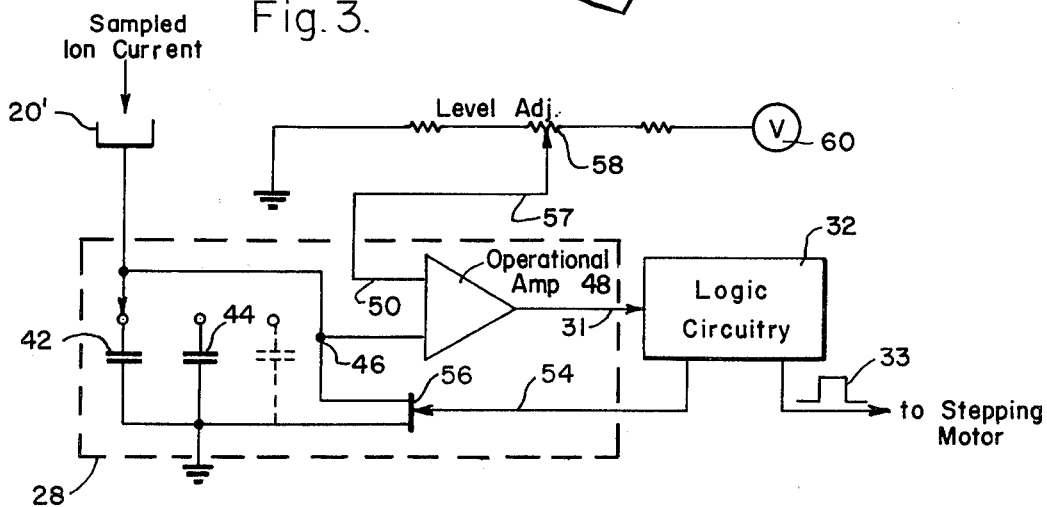
FIG. 3 is a schematic diagram of the ion beam current sensing and integrating circuitry of FIG. 1.

Referring now to FIg. 3, the Faraday cup 20' represents one or more of the ion beam current sensors, and the current from the latter charges one or more input integrating capacitors 42 and 44 connected as shown at one differential input terminal 46 of a conventional differential operational amplifier 48. When the voltage level on the input terminal 46 exceeds the DC threshold level on the other input terminal 50, an output pulse is generated on the output line 31 and is coupled therefrom to the input of the digital logic circuitry 32. As previously mentioned, the logic circuitry 32 preferably includes a known Schmitt trigger-type circuit which provides a square wave digital output pulse train in response to the nominally triangular shaped pulses at the output of the operational amplifier 48.

Simultaneously, the logic circuitry 32 is utilized to generatea capacitor discharge feedback pulse on line 54 which couples into the gate electrode of a junction field. effect transistor 56. This field effect transistor 56 is connected as shown in parallel with the input capacitors 42 and 44 of the operational amplifier 48, and this FET 56 conducts and thus rapidly discharges these active capacitors each time the logic circuitry 32 is switched by the output signal of the operational amplifier 48. In this manner, rapid incremental integration of the input signal current from the Faraday cup 20' is achieved; and the number of integrations per unit time provided by the integrator 28 and thus the total dose delivered to the wafers can be closely controlled by the appropriate choice of the size or number (or both) of the integrating capacitors 42 and 44. These capacitors are only representative of any desired plurality of input capacitors corresponding to the necessary number of calibration range settings of the integrator 28.

The input terminal 50 of the differential operational amplifier 48 is connected to a variable tap 57 on a level adjustment potentiometer resistor 58. By varying the position of this tap 57, the DC threshold voltage on the input terminal 50 and thus the switching level of the operational amplifier 48 can be varied. Thus, the time at which the output pulse 30 appears at the output of the operational amplifier 48 may be controlled both by varying its input capacitance and by changing its DC set point or reference voltage applied to terminal 50.

In accordance with the present invention, it is possible to make an absolute calibration of the integrator 28, and one needs to know only the value of shunt capacitance at the input of the operational amplifier 48 and the voltage to which this capacitance is being charged. The latter quantities, of course, can be directly correlated to the ion doping density, so that an unskilled operator may select a particular ion dosage range by choosing a corresponding capacitor setting which connects one or more of the capacitors 42 and 44 to the operational amplifier 48. Thereafter, the potentiometer tap 57 may be varied to change the ion doping density within this previously chosen range, and this potentiometer tap 57 may be easily controlled by a dial or the like. This extreme simplicity of both the integrator 28 design and its above calibration is particularly advantageous, both from the standpoint of system design costs and operational costs as well.

In a control system of the type described above which was actually built and successfully operated, each incremental dose was 1/400 of the required programmed dose for the ion implanted wafers 12. Thus, the ion dose necessary to step the motor 34 once was a small but definite fraction of the total required dose, and this above fraction may be increased or decreased by design for a particular fabrication process. As the limit of the incremental ion dose becomes infinitely small, the above ion dosage control system becomes continuous, and in a truly continuous system, the motor stepping rate becomes a smooth actual velocity and the incremental dose measurement becomes a measure of instantaneous current. Thus, the resent system may, if desired, be modified by those skilled in the art to operate as smooth continuous system, and such modification would clearly be within the spirit and scope of this invention.

The present invention is not limited to the ion implantation in semiconductive materials, and may be used to control any process where it is desired to control the introduction (dosage) of accelerated charged particles into electronic or other materials to change their electrical characteristics.

It should also be understood that the present invention is not limited to the particular relative movement set up in FIG. 1 wherein a target is moved relative to a fixed ion beam. Obviously, the present invention could be employed for use with a fixed wafer support member 10 and a movable ion beam by altering the mechanical drive coupling 36 so that the output of the stepping motor 34 would drive the ion source rather than the wafer support member 10.

What is claimed is:
1. A system for controlling the ion implantation dosage in electronic material including:
    a. means for exposing a target area to an ion beam pattern or raster;
    b. means for providing relative motion between said target area and said pattern or raster;
    c. means for sampling and for incrementally integrating the ion beam current a plurality of times as said material is passed through said target area and for generating a control signal in response thereto; and
    d. means responsive to said control signal for providing controlled relative movement between said beam pattern or raster and the actual target surface area upon which said beam falls, whereby a plurality of wafers may be continuously mounted and demounted at a surface which subsequently undergoes controlled relative movement with respect to said ion beam, thereby achieving continuous or quasi-continuous ion implantation dosage control of said wafers.

2. The system defined in claim 1 wherein said control signal generating means includes a circuit means responsive to the incremental integration of said ion beam current for producing a plurality of output pulses which are utilized to control the above said relative movement.

3. The system defined in claim 1 wherein said integrating means includes:
    a. a differential operational amplifier having one or more integrating capacitors connected to one differential input terminal thereof for providing control over the range of the integration time of said integrating means, and b. a variable DC threshold voltage connectable to another differential input terminal of said amplifier for controlling the specific integration time within said range.

4. The system defined in claim 2 wherein:

a. said circuit means includes digital logic circuitry connected to said integrating means for generating control pulses; and b. said means for controlling relative movement includes a stepping motor coupled between said logic circuitry and the surface area upon which said wafers are mounted for moving said wafers relative to saidion beam pattern or raster at a controlled rate.

5. The system defined in claim 1 wherein said means for providing relative movement includes:

a. continuously movable wafer support means mounted beneath said ion beam; and said system further including b. a mask positoned between said support means and the source of sid ion beam for controlling the target implantation area through which said ions penetrate.

6. The system defined in claim 5 wherein said mask includes current sensing means adjacent a beam passageway in said mask for sensing the current density of said ion beam.

7. The system defined in claim 6 wherein said means for providing relative movement further includes:

a. digital logic circuitry connected to said integrating means for generating control pulses; and b. a stepping motor coupled between said logic circuitry and the surface area upon which said wafers are mounted for moving said surface area through said ion beam at a controlled rate in response to said control pulses.

8. The system defined in claim 7 wherein said integrating means includes:

a. a differential operational amplifier having one or more integrating capacitors connected on one differential input terminal thereof for providing control over the range of the integration time of said integrating means, and b. a variable DC threshold voltage connectable to another differential input terminal of said amplifier for controlling the specific integration time within said range.

9. The system defined in claim 8 which further includes a feedback connection between said logic circuitry and one input of said opertional amplifier and including a gated semiconductor device connected in parallel with said one or more capacitors, said semiconductor device being biased to conduction by feedback pulses from said logic circuitry to rapidly discharge said one or more capacitors for each integraton increment of said integrating means.

10. A process for controlling the ion implantation dosage in electronic materials including the step of:

a. exposing a target area to an ion beam pattern or raster, b. sampling and incrementally integrating the ion beam current a plurality of times as said material is passed through said target area and generating a control signal in response thereto, and c. providing controlled incremental relative movement between said beam pattern or raster and the beam target area in response to said control signla, whereby a plurality of wafers may be continuously mounted and demounted at a surface which subsequently undergoes controlled relative movement with respect to said ion beam, thereby achieving continuous or quasi-continuous ion implantation dosage control of said wafers.

11. The process defined in claim 10 wherein said incremental integration includes generating a plurality of output pulses in response to said ion beam current, whereby suitable electro-mechanical means may be utilized to respond to said pulses and to provide said controlled relative movement between said beam pattern or raster and said target surface area.

12. A system for controlling the ion implantation dosage in electronic materinal including:

a. particle acceleration means for exposing a target area to a particle beam pattern or raster;

b. control means for sampling particle beam curent and for generating a control signal as a function of the particle dosage of said beam pattern or raster; and c. electromechanical stepping means coupled between said control means and one of said target are or said pattern or raster and responsive to said control signal for, in turn, providing controlled relative movement between said beam pattern or raster and the actual target surface upon which said particle beam falls, whereby the dosage of particles implanted into said target area is maintained at controlled levels, even during unknown variations in intensity of said particle beam pattern or raster.

13. A system for controlling the ion dosage in electronic material including;

a. means for exposing a target area to an ion beam pattern or raster;

b. means for sampling and for incrementally integrating the ion beam current a plurality of times as said material is passed through said target area and for generating a control signal in response thereto; and c. electromechanical drive means coupled between said integrating means and one of said target area or said pattern or raster and responsive to said control signal for providing controlled relative movement between said beam pattern or raster and the actual target surface area upon which said beam falls, whereby a plurality of waters may be continuously mounted and demounted at a surface which subsequently undergoes controlled relative movement with respect to said ion beam thereby achieving continuous on quasi-continuous ion implantation dosage cntrol of said wafers.

14. The system defined in claim 13 wherein said control signal generating means includes circuit means responsive to the incremental integration of said ion beam current for producing a plurality of output pulses which are utilized to control the above said relative movement.

15. A system for controlling the ion implantation dosage in electronic material including:

a. means for exposing a target area to an ion beam pattern or raster;

b. means for providing relative motion between said target area and said pattern or raster;

c. means for sampling and for incrementally integrating the ion beam current a plurality of times as said material is exposed to said ion beam and for generating a control signal in response thereto; and d. means responsive to said control signal for providing controlled relative movement between said beam pattern or raster and the actual target surface area upon which said beam falls, whereby a plurality of wafers may be continuously mounted and demounted at a surface which subsequently undergoes contolled relative movement with respect to said ion beam, thereby achieving continuous or quasi-continuous ion implantation dosage control of said wafers.

* * * * *